United States Patent
Kim

(10) Patent No.: US 6,380,028 B1
(45) Date of Patent: Apr. 30, 2002

(54) SEMICONDUCTOR DEVICE AND A METHOD OF MANUFACTURING THEREOF

(75) Inventor: Yong Hae Kim, Seoul (KR)

(73) Assignee: Hyundai Electronics Industries Co., Ltd., Kyungki-Do (KR)

(*) Notice: Subject to any disclaimer, the term of this patent is extended or adjusted under 35 U.S.C. 154(b) by 0 days.

(21) Appl. No.: 09/545,579

(22) Filed: Apr. 7, 2000

(30) Foreign Application Priority Data

Apr. 8, 1999 (KR) .............................................. 99-12248

(51) Int. Cl.[7] .......................................... H01L 21/8242
(52) U.S. Cl. ...................... 438/253; 438/255; 438/397
(58) Field of Search ................................ 438/253, 255, 438/254, 396, 397, 398, 977, 386, 701, 705, 244, 387; 257/303, 306, 309, 308, 296

(56) References Cited

U.S. PATENT DOCUMENTS

| 4,143,393 A | 3/1979 | DeMaria et al. |
| 4,622,570 A | 11/1986 | Taguchi |
| 5,187,557 A | 2/1993 | Zenke |
| 5,189,503 A | 2/1993 | Suguro et al. |
| 5,449,630 A | * 9/1995 | Lur et al. .................... 438/386 |
| 5,567,964 A | 10/1996 | Kashihara et al. |
| 5,684,316 A | * 11/1997 | Lee .............................. 257/306 |
| 5,726,086 A | 3/1998 | Wu |
| 5,821,139 A | 10/1998 | Tseng |
| 5,843,820 A | 12/1998 | Lu |

FOREIGN PATENT DOCUMENTS

KR          99-5921        1/1999

* cited by examiner

Primary Examiner—Douglas A. Wille
Assistant Examiner—Theresa T. Doan
(74) Attorney, Agent, or Firm—Pennie & Edmonds LLP

(57) ABSTRACT

This invention discloses a semiconductor device which comprises a thin semiconductor substrate; first and second word lines formed on the thin semiconductor substrate; a first source, a common drain and a second source formed on the thin semiconductor substrate; a bit line connected to the common drain; a first capacitor formed in front of the thin semiconductor substrate, with the first capacitor having a first charge storage electrode connected to the first source, a first dielectric film and a first plate electrode; and a second capacitor formed in reverse side of the thin semiconductor substrate, with the second capacitor having a second charge storage electrode connected to the second source, a second dielectric film and a second plate electrode.

19 Claims, 3 Drawing Sheets

US 6,380,028 B1

SEMICONDUCTOR DEVICE AND A METHOD OF MANUFACTURING THEREOF

BACKGROUND OF THE INVENTION

1. Field of the Invention

This invention relates to a semiconductor device and a method of manufacturing thereof; in particular to a semiconductor device and a method of manufacturing thereof which can secure margin of a contact process and extremely increased capacitance of a capacitor in restricted area by alternately disposing capacitors, which are formed around a central word line, in front and backside of a semiconductor substrate.

2. Description of the Prior Art

Generally, as a semiconductor device becomes high integration and miniaturization, occupied area of each element of the semiconductor device is reduced. Although size of the semiconductor device is reduced, it is required to secure a minimum capacitance of a capacitor which is necessary to drive the semiconductor device. To secure the capacitance, a charge storage electrode of a capacitor has being manufactured in three-dimensional structure such as a stack structure, a pin structure and a cylinder structure.

FIGS. 1A to 1C are sectional views for explaining a conventional semiconductor device and a method of manufacturing thereof.

Referring to FIG. 1A, an active region is defined by forming an isolation layer 2 on a semiconductor substrate 1. The isolation layer 2 is formed by filling a trench with insulation material such as oxide, in which the trench is formed by etching the semiconductor substrate 1 with desired depth. A first word line 4A and a second word line 4B are formed on the semiconductor substrate 1 of the active region. The first and second word lines 4A and 4B are electrically isolated from the semiconductor substrate by a gate insulation layer 3 and electrically isolated from the outside by a first cap insulation layer 5 and a first spacer insulation layer 6. A first source 7A, a second source 7B and a common drain 7C are formed in the semiconductor substrate by means of an ion implantation process for source and drain regions. The first source 7A is disposed at the outside of the first word line 4A and the second source 7B is disposed at the outside of the second word line 4B and the common drain 7C is disposed between the first and second word lines 4A and 4B. A first inter-insulation layer 8 is formed on an entire structure including the first and second word lines 4A and 4B. Contact holes are formed by etching portions of the inter-insulation layer 8 by a self align contact process so that-the first and second sources 7A and 7B and the common drain 7C are exposed. By polysilicon deposition and chemical mechanical polishing process, the contact holes are only filled with polysilicon, whereby a first contact plug 9A connected to the first source 7A, a second contact plug 9B connected to the second source 7B and a bit line contact plug 9C connected to the common drain 7C are formed.

Referring to FIG. 1B, a bit line 10 is formed on the first inter-insulation layer 8, in which the bit line 10 is electrically connected to the common drain 7C through the bit line contact plug 9C. The bit line 10 is isolated from the out side by a second cap insulation layer 11 and a second inter-insulation layer 13. A second inter-insulation layer 13 is formed on an entire structure including the second cap insulation layer 11 and the second spacer insulation layer 12. Portions of the second inter-insulation layer 13 is etched by means of a contact process for a charge storage electrode so that contact holes to expose the first contact plug 9A and the second contact plug 9B are formed. By polysilicon deposition and chemical mechanical polishing process, the contact holes are only filled with polysilicon, whereby a first charge storage electrode contact plug 14A connected to the first contact plug 9A, a second charge storage contact plug 14B connected to the second contact plug 9B are formed.

Referring to FIG. 1C, a first charge storage electrode 15A connected to the first charge storage electrode contact plug 14A and a second charge storage 15B connected to the second charge storage electrode contact plug 14B are formed by means of the polysilicon deposition and patterning processes. A dielectric film 16 is formed on a surface of the first and second charge storage electrodes 15A and 15B and a plate electrode 17 is formed on the dielectric film 16, thereby forming a capacitor. Thereafter, a third inter-insulation layer 18 is formed so that the capacitor is covered.

In case of manufacturing a semiconductor device by the above conventional method, since the semiconductor device becomes high integration and miniaturization, distance between the first and second charge storage electrode contact plugs 14A and 14B is shorted and area of the first and second charge storage electrodes is also reduced. There is a limit to reduce area of the first and second charge storage electrodes since they are disposed to neighbor from each other. Also, Although size of the semiconductor device is reduced, it is required to secure a minimum capacitance of a capacitor which is necessary to drive the semiconductor device. To secure the capacitance, a charge storage electrode of a capacitor has being manufactured in three-dimensional structure but it is a problem in that a manufacturing process is difficult. If a process margin between a charge storage electrode contact plug and a charge storage electrode is insufficient, the charge storage electrode contact plug is attacked due to misalignment occurred when an etching process for forming the charge storage electrode is performed, whereby a device is not normally operated. In addition, in a device applying a design rule of 0.13 $\mu$m, an etching target must be over 10,000 Å to form a charge storage electrode having a simple stack structure. Accordingly, it is a burden to the etching process and it is a problem in that distance between charge storage electrodes is short and the electrodes are shorted.

SUMMARY OF THE INVENTION

Therefore, it is an object of the invention to provide a semiconductor device and a method of manufacturing thereof, which can secure margin of a contact process and extremely increase capacitance of a capacitor in restricted area and improve reliability and yield of a device and realize high integration and miniaturization of a device by alternately disposing capacitors, which are formed around a central word line, in front and backside of a semiconductor substrate.

To achieve the above object, a semiconductor device according to the present invention comprises:

a thin semiconductor substrate;

first and second word lines formed on the thin semiconductor substrate;

a first source, a common drain and a second source formed on the thin semiconductor substrate;

a bit line connected to the common drain;

a first capacitor formed in front of the thin semiconductor substrate, with the first capacitor having a first charge storage electrode connected to the first source, a first dielectric film and a first plate electrode; and a second capacitor formed in reverse side of the thin semiconductor substrate, with the second capacitor having a second charge storage electrode connected to the second source, a second dielectric film and a second plate electrode.

A method of manufacturing a semiconductor device according to the present invention comprises the steps of:

forming a gate insulation layer, a first word line, a second word line, a first source, a common drain and a second source on a semiconductor substrate;

forming a first inter-insulation layer and forming a bit line electrically connected to the common drain on the first inter-insulation layer;

forming a second inter-insulation layer and forming a first charge storage electrode electrically connected to the first source on said second inter-insulation layer;

sequentially forming a first dielectric film and a first plate electrode on the first charge storage electrode and sequentially forming a third inter-insulation layer and a substrate support layer thereon;

polishing a reverse side of the semiconductor substrate so that the semiconductor substrate is thin;

forming a fourth inter-insulation layer on the reverse side of the thin semiconductor substrate and forming a second charge storage electrode electrically connected to the second source on the fourth inter-insulation layer; and sequentially forming a second dielectric film, a second plate electrode and a fifth inter-insulation layer on the second charge storage electrode.

BRIEF DESCRIPTION OF THE DRAWINGS

The aforementioned aspects and other features of the present invention will be explained in the following description, taken in conjunction with the accompanying drawing, wherein.

DETAILED DESCRIPTION OF THE DRAWINGS

FIGS. 2A to 2E are sectional views for explaining a semiconductor device and a method of manufacturing thereof according to the present invention.

Figure 1A:
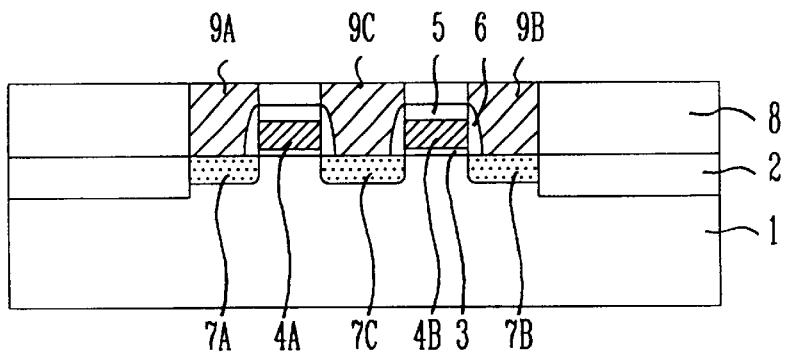
FIGS. 1A to 1C are sectional views for explaining a conventional semiconductor device and a method of manufacturing thereof.
Figure 1B:
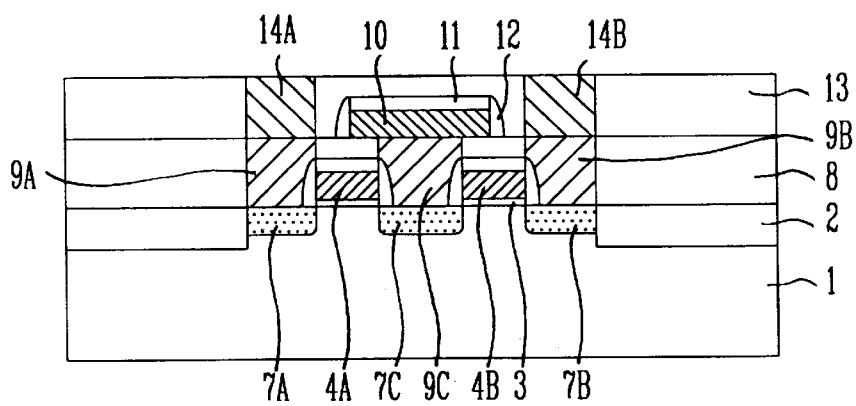
Figure 1C:
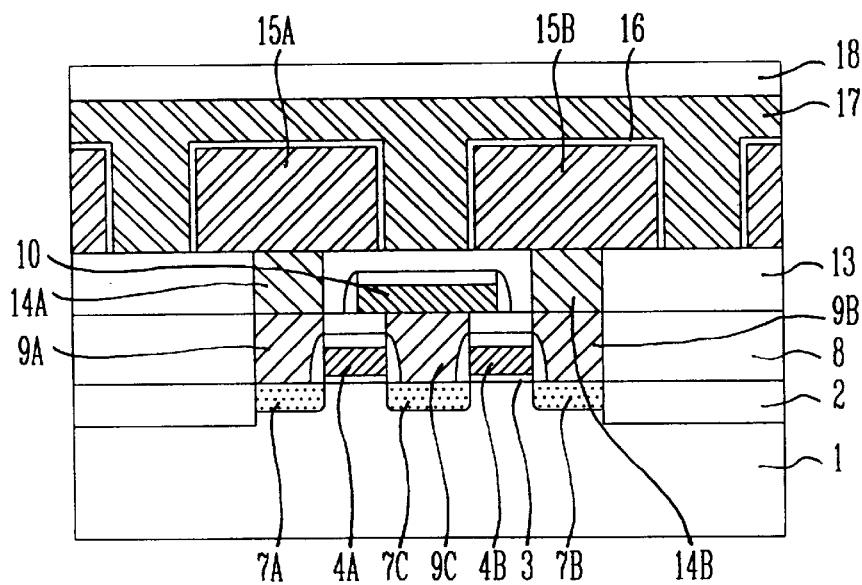
Figure 2A:
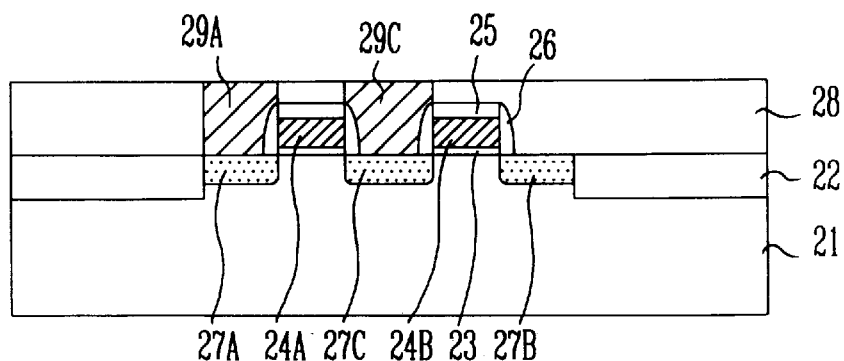
FIGS. 2A to 2E are sectional views for explaining a semiconductor device and a method of manufacturing thereof according to the present invention.

Referring to FIG. 2A, an active region is defined by forming an isolation layer 22 on a semiconductor substrate 21. The isolation layer 22 is formed by filling a trench with insulation material such as oxide, in which the trench is formed by etching the semiconductor substrate 21 with desired depth. A first word line 24A and a second word line 24B are formed on the semiconductor substrate 21 of the active region. The first and second word lines. 24A and 24B are electrically isolated from the semiconductor substrate 21 by a gate insulation layer 23 and electrically isolated from the outside by a first cap insulation layer 25 and a first spacer insulation layer 26. A first source 27A, a second source 27B and a common drain 27C are formed in the semiconductor substrate 21 by means of an ion implantation process for source and drain regions. The first source 27A is disposed at the outside of the first word line 24A and the second source 27B is disposed at the outside of the second word line 24B and the common drain 27C is disposed between the first and second word lines 24A and 24B. A first inter-insulation layer 28 is formed on an entire structure including the first and second word lines 24A and 24B. Contact holes are formed by etching portions of the inter-insulation layer 28 by a self align contact process so that the first and second sources 27A and 27B and the common drain 27C are exposed. By polysilicon deposition and chemical mechanical polishing process, the contact holes are only filled with polysilicon, whereby a contact plug 29A connected to the first source 27A and a bit line contact plug 29C connected to the common drain 27C are formed.

Figure 2B:
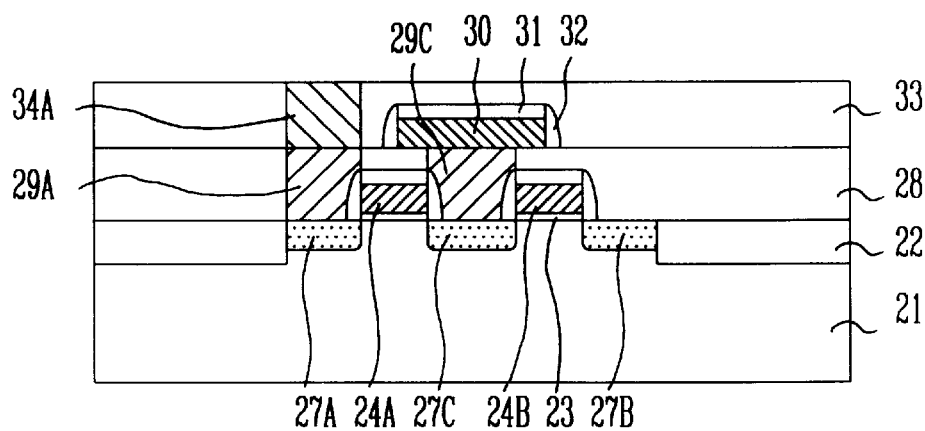

Referring to FIG. 2B, a bit line 30 is formed on the first inter-insulation layer 28, in which the bit line 30 is electrically connected to the common drain 27C through the bit line contact plug 29C. The bit line 30 is isolated from the out side by a second cap insulation layer 31 and a second spacer insulation layer 32. A second inter-insulation layer 33 is formed on an entire structure including the second cap insulation layer 31 and the second spacer insulation layer 32. A portion of the second inter-insulation layer 33 is etched by means of a contact process for a charge storage electrode so that a contact hole to expose the first contact plug 29A is formed. By polysilicon deposition and chemical mechanical polishing processes, the contact hole is only filled with polysilicon, whereby a first charge storage electrode contact plug 34A connected to the contact plug 29A is formed.

Figure 2C:
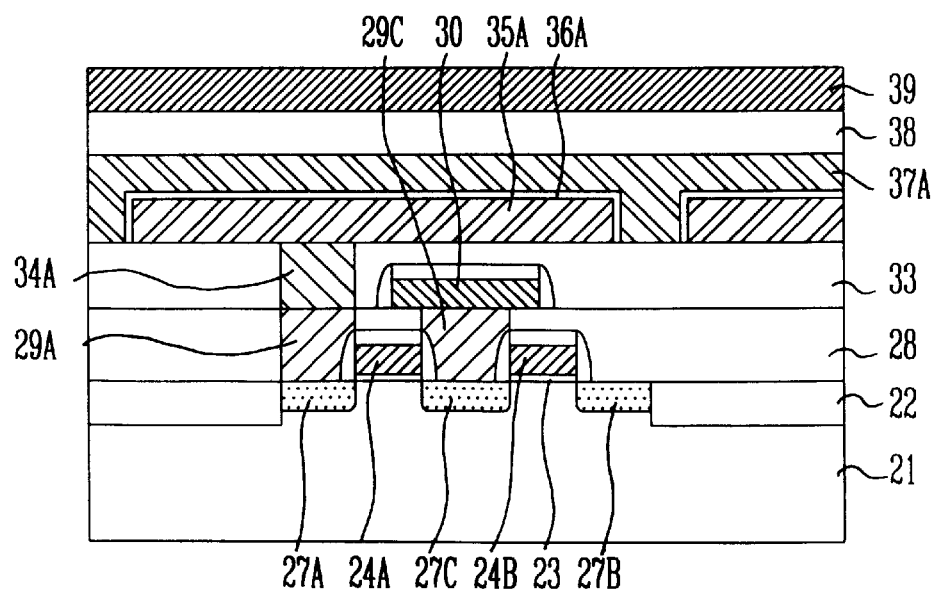

Referring to FIG. 2C, any one material of polysilicon, titanium and platinum and so on is deposited on the second inter-insulation layer 33 and patterned, thereby forming a first charge storage electrode 35A connected to the first charge storage electrode contact plug 34A. A first dielectric film 36A and a first plate electrode 37A are sequentially formed on the first charge storage electrode 35A so that a first capacitor connected to the first source 27A is formed in front of the semiconductor substrate 21. A third inter-insulation:n layer 38 covering the first capacitor is formed on the entire structure and a substrate support layer 39 is then formed on the third inter-insulation layer 38.

In the above process, the first charge storage electrode 35A may be formed with various structures such as a stack structure, a pin structure, a cylinder structure and so on if necessary. The first plate electrode 37A is formed with polysilicon, titanium and platinum and so on like the first charge storage electrode 35A. The first dielectric film 36A is formed with ONO (Oxide-Nitride-Oxide), $Ta_2O_5$, BST and so on. The substrate support layer 39 acts prevention of breaking the semiconductor substrate 21 when the subsequent polishing process is performed to be thin the semiconductor substrate 21 and must be deposited with thick polysilicon.

Figure 2D:
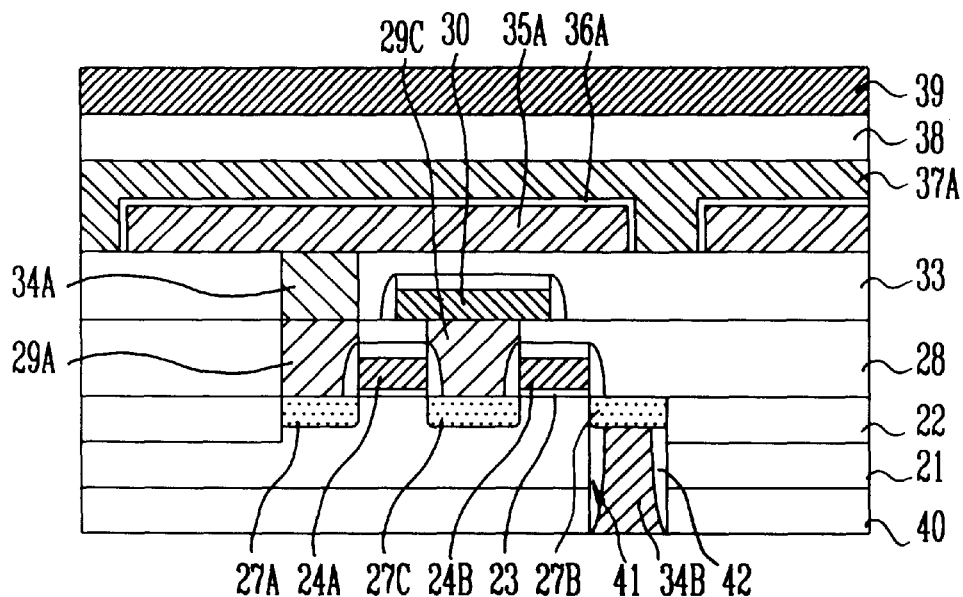

Referring to FIG. 2D, the semiconductor substrate 21 is turned over and the reverse side of the semiconductor substrate 21 is polished by means of the chemical mechanical polishing process to be thin the semiconductor substrate 21. A fourth inter-insulation layer 40 is formed on the reverse side of the thin semiconductor substrate 21. A portion of the semiconductor substrate 21 is exposed by etching a portion of the fourth inter-insulation layer 40 by means of a contact process for a charge storage electrode. Continuously, the exposed semiconductor substrate 21 is etched until the second source 27B is exposed, thereby forming a contact hole 41 for a charge storage electrode. A third spacer insulation layer 42 is formed on the inside wall of the contact hole 41. By polysilicon deposition and chemical mechanical polishing processes, the contact hole 41 is only filled with polysilicon, whereby a second charge storage electrode contact plug 34B connected to the second source 27B is formed.

In the above process, to form the contact hole on the near neighborhood of the second source 27B with easy, it is necessary to polish the reverse side of the semiconductor substrate 21. The third spacer insulation layer 42 is used to electrically isolate between the semiconductor substrate 21 exposed at the inside wall of the contact hole 41 and the second charge storage electrode contact plug 34B and is formed by depositing and etch back oxide, nitride or oxide/nitride.

Figure 2E:
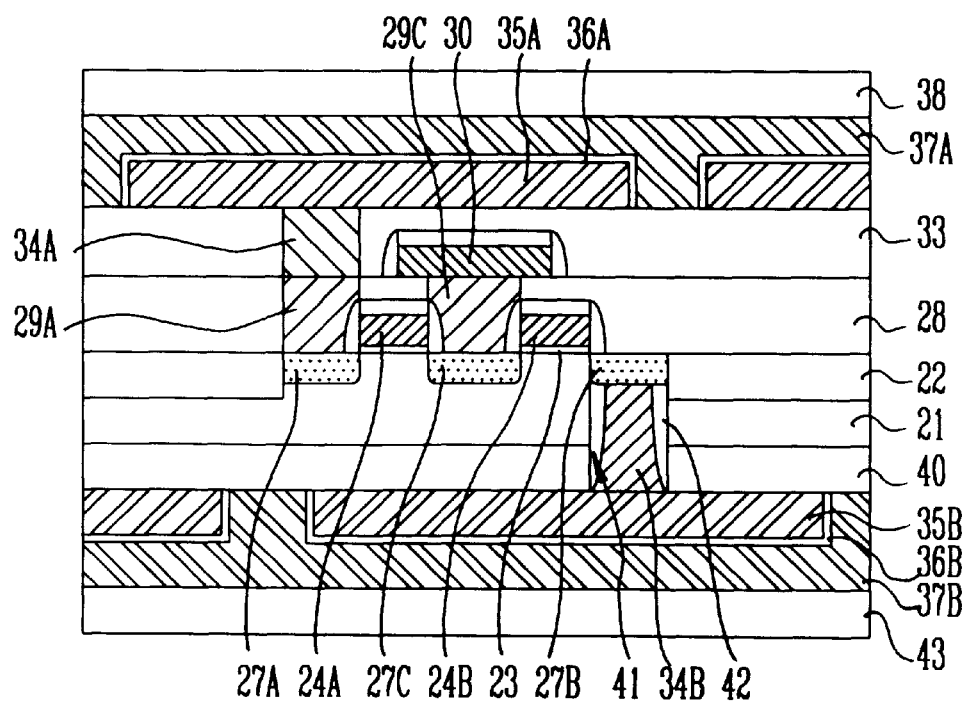

Referring to FIG. 2E, any one material of polysilicon, titanium and platinum and so on is deposited on the fourth inter-insulation layer 40 and then patterned, thereby forming a second charge storage electrode 35B connected to the second charge storage electrode contact plug 34B. A second dielectric film 36B and a second plate electrode 37B are sequentially formed on the second charge storage electrode 35B so that a second capacitor connected to the second source 27B is formed in reverse of the thin semiconductor substrate 21. A fifth inter-insulation layer 43 covering the second capacitor is formed on the entire structure and a substrate support layer 39 is then removed.

In the above process, the second charge storage electrode 35B may be formed with various structures such as a stack structure, a pin structure, a cylinder structure and so on if necessary. The second plate electrode 37B is formed with polysilicon, titanium and platinum and so on like the second charge storage electrode 35B. The second dielectric film 36B is formed with ONO (Oxide-Nitride-Oxide), $Ta_2O_5$, BST and so on.

In a semiconductor device according to an embodiment of the present invention, a first capacitor including first and second word lines 24A and 24B, a bit line 30 connected to a common drain 27C and a first charge storage electrode 35A connected to a first source 27A is formed in front of a thin semiconductor substrate 21, while a second capacitor including a second charge storage electrode 35B connected to a second source 27B is formed in reverse side of the thin semiconductor substrate 21.

In the mean time, an embodiment of the present invention has been illustrated a semiconductor device having two word lines 24A and 24B, a common drain 27C, a bit line 29C and two charge storage electrodes 35A and 35B as basic elements. However, an actual semiconductor device has a plurality of basic elements each of which is identical to structure of the present invention.

As described above, a semiconductor device and method of manufacturing the same according to the present invention can secure margin of a contact process and extremely increase capacitance of a capacitor in restricted area and improve reliability and yield of a device and realize high integration and miniaturization of a device by alternately disposing capacitors, which are formed around a central word line, in front and backside of a semiconductor substrate.

The present invention has been described with reference to a particular embodiment in connection with a particular application. Those having ordinary skill in the art and access to the teachings of the present invention will recognize additional modifications and applications within the scope thereof.

What is claimed is:

1. A method of manufacturing a semiconductor device, comprising the steps of:

forming a gate insulation layer, a first word line, a second word line, a first source, a common drain and a second source on a semiconductor substrate;

forming a first inter-insulation layer and forming a bit line electrically connected to said common drain on said first inter-insulation layer;

forming a second inter-insulation layer and forming a first charge storage electrode electrically connected to said first source on said second inter-insulation layer;

sequentially forming a first dielectric film and a first plate electrode on said first charge storage electrode and sequentially forming a third inter-insulation layer and a substrate support layer thereon;

polishing a reverse side of said semiconductor substrate so that said semiconductor substrate is thin;

forming a fourth inter-insulation layer on the reverse side of said thin semiconductor substrate and forming a second charge storage electrode electrically connected to said second source on said fourth inter-insulation layer; and sequentially forming a second dielectric film, a second plate electrode and a fifth inter-insulation layer on said second charge storage electrode; wherein said second charge storage electrode is electrically connected to said second source via a second charge storage electrode contact plug which is formed by etching a portion of said fourth inter-insulation layer and the thin semiconductor substrate to expose said second source and form a contact hole, and then filling said contact hole with polysilicon; and further comprising forming a spacer insulation layer on an inner side wall of said contact hole to isolate between said thin semiconductor substrate and said second charge storage electrode contact plug.

2. The method of claim 1, wherein said bit line is electrically connected to said common drain through a bit line contact plug which is formed by etching a portion of said first inter-insulation layer to thereby expose said common drain and form a contact hole, and by filling said contact hole with polysilicon.

3. The method of claim 1, wherein said first charge storage electrode is electrically connected to said first source via a first change storage electrode contact plug which is formed by etching a portion of said first inter-insulation layer to thereby expose said first source and form a first contact hole, and by forming a contact plug, which is formed by filling said first contact hole, and a second contact hole, which is formed by etching a portion of said second inter-insulation layer, and by filling said second contact hole with polysilicon.

4. The method of claim 1, wherein said first and second charge storage electrodes, and said first and second plate electrodes are formed with any one material of polysilicon, titanium and platinum.

5. The method of claim 1, wherein said first and second dielectric films are formed with any one from the group consisting of ONO, $Ta_2O_5$, and BST.

6. The method of claim 1, wherein said substrate support layer is formed by thickly depositing polysilicon to prevent breaking said semiconductor substrate during a polishing process to thin said semiconductor substrate.

7. The method of claim 1, wherein said spacer insulation layer is formed by depositing and then etching back oxide, nitride or oxide/nitride.

8. A method of manufacturing a semiconductor device, comprising the steps of:

forming a gate insulation layer, a first word line, a second word line, a first source, a common drain and a second source on a first side of a semiconductor substrate;

forming a first inter-insulation layer and forming a bit line electrically connected to said common drain on said first inter-insulation layer;

forming a second inter-insulation layer;

forming a first charge storage electrode electrically connected to said first source on said second inter-insulation layer, without also forming a charge storage electrode electrically connected to said second source on the first side of the semiconductor substrate;

sequentially forming a first dielectric film and a first plate electrode on said first charge storage electrode and sequentially forming a third inter-insulation layer and a substrate support layer thereon;

forming a fourth inter-insulation layer on a reverse, second side of the semiconductor substrate;

forming a second charge storage electrode electrically connected to said second source on said fourth inter-insulation layer, without also forming a charge storage electrode electrically connected to said first source on the second side of the semiconductor substrate; and sequentially forming a second dielectric film, a second plate electrode and a fifth inter-insulation layer on said second charge storage electrode, such that, in the resulting device.

9. The method of claim 8, wherein said bit line is electrically connected to said common drain through a bit line contact plug which is formed by etching a portion of said first inter-insulation layer to thereby expose said common drain and form a contact hole, and by filling said contact hole with polysilicon.

10. The method of claim 8, wherein said first charge storage electrode is electrically connected to said first source via a first change storage electrode contact plug which is formed by etching a portion of said first inter-insulation layer to thereby expose said first source and form a first contact hole, and by forming a contact plug, which is formed by filling said first contact hole, and a second contact hole, which is formed by etching a portion of said second inter-insulation layer, and by filling said second contact hole with polysilicon.

11. The method of claim 8, wherein said first and second charge storage electrodes, and said first and second plate electrodes are formed with any one material of polysilicon, titanium and platinum.

12. The method of claim 8, wherein said first and second dielectric films are formed with any one from the group consisting of ONO, $Ta_2O_5$, and BST.

13. The method of claim 8, wherein said substrate support layer is formed by thickly depositing polysilicon to prevent breaking said semiconductor substrate during a polishing process of said semiconductor substrate.

14. The method of claim 8, wherein said second charge storage electrode is electrically connected to said second source via a second charge storage electrode contact plug which is formed by:

etching a portion of said fourth inter-insulation layer and the semiconductor substrate to thereby expose said second source and form a contact hole; and filling said contact hole with polysilicon.

15. The method of claim 14, further comprising forming a spacer insulation layer on an inner side wall of said contact hole to isolate between said semiconductor substrate and said second charge storage electrode contact plug.

16. The method of claim 15, wherein said spacer insulation layer is formed by depositing and then etching back oxide, nitride or oxide/nitride.

17. A method of manufacturing a semiconductor device, comprising the steps of:

forming a gate insulation layer, a first word line, a second word line, a first source, a common drain and a second source on a first side of a semiconductor substrate;

forming a first inter-insulation layer and forming a bit line electrically connected to said common drain on said first inter-insulation layer;

forming a first charge storage contact plug in the first inter-insulation layer to connect only to the first source, without also forming a charge storage contact plug in the first inter-insulation layer to connect to the second source;

forming a second inter-insulation layer;

forming a first charge storage electrode electrically connected to said first source on said second inter-insulation layer, the first charge storage electrode connecting to the first source via the first charge storage contact plug;

sequentially forming a first dielectric film and a first plate electrode on said first charge storage electrode and sequentially forming a third inter-insulation layer and a substrate support layer thereon;

forming a fourth inter-insulation layer on a reverse, second side of the semiconductor substrate;

forming a second charge storage electrode electrically connected to said second source on said fourth inter-insulation layer, without also forming a charge storage electrode electrically connected to said first source on the second side of the semiconductor substrate; and sequentially forming a second dielectric film, a second plate electrode and a fifth inter-insulation layer on said second charge storage electrode, such that, in the resulting device.

18. The method of claim 17, wherein said second charge storage electrode is electrically connected to said second source via a second charge storage electrode contact plug which is formed by:

etching a portion of said fourth inter-insulation layer and the semiconductor substrate to thereby expose said second source and form a contact hole; and filling said contact hole with polysilicon.

19. The method of claim 18, further comprising forming a spacer insulation layer on an inner side wall of said contact hole to isolate between said semiconductor substrate and said second charge storage electrode contact plug.

* * * * *